(12) United States Patent
Rose et al.

(10) Patent No.: US 10,050,034 B2
(45) Date of Patent: Aug. 14, 2018

(54) SEMICONDUCTOR DEVICE AND ASSOCIATED METHODS

(71) Applicant: Nexperia B.V., Nijmegen (NL)

(72) Inventors: Matthias Rose, Helmond (NL); Jan Sonsky, Leuven (BE)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/233,785

(22) Filed: Aug. 10, 2016

(65) Prior Publication Data
US 2017/0062419 A1 Mar. 2, 2017

(30) Foreign Application Priority Data

Aug. 27, 2015 (EP) ..................................... 15182739

(51) Int. Cl.
| | |
|---|---|
| *H01L 27/088* | (2006.01) |
| *H01L 27/02* | (2006.01) |
| *H01L 21/8236* | (2006.01) |
| *H01L 29/16* | (2006.01) |
| *H01L 29/20* | (2006.01) |

(Continued)

(52) U.S. Cl.
CPC ...... *H01L 27/0883* (2013.01); *H01L 21/8236* (2013.01); *H01L 27/0255* (2013.01); *H01L 29/1608* (2013.01); *H01L 29/2003* (2013.01); *H01L 29/872* (2013.01); *H02M 3/158* (2013.01); *H03K 17/6871* (2013.01);

(Continued)

(58) Field of Classification Search
CPC ............... H01L 27/0255; H01L 27/085; H01L 27/0266; H01L 27/0629
See application file for complete search history.

(56) References Cited

U.S. PATENT DOCUMENTS

| | | |
|---|---|---|
| 2012/0292635 A1 | 11/2012 | Iketani et al. |
| 2014/0145208 A1 | 5/2014 | Rose et al. |
| 2014/0284655 A1 | 9/2014 | Ikeda |

FOREIGN PATENT DOCUMENTS

| | | |
|---|---|---|
| EP | 2 736 171 A1 | 5/2014 |
| EP | 2 819 164 A2 | 12/2014 |

OTHER PUBLICATIONS

Extended European Search Report for Patent Appln. No. 15182739.1 (dated Feb. 23, 2016).

*Primary Examiner* — Julia Slutsker
(74) *Attorney, Agent, or Firm* — Ohlandt, Greeley, Ruggiero & Perle, L.L.P.

(57) ABSTRACT

A semiconductor device comprising: a die-source-terminal, a die-drain-terminal and a die-gate-terminal; a semiconductor-die; an insulated-gate-depletion-mode-transistor provided on the semiconductor-die, the insulated-gate-depletion-mode-transistor comprising a depletion-source-terminal, a depletion-drain-terminal and a depletion-gate-terminal, wherein the depletion-drain-terminal is coupled to the die-drain-terminal and the depletion-gate-terminal is coupled to the die-source-terminal; an enhancement-mode-transistor comprising an enhancement-source-terminal, an enhancement-drain-terminal and an enhancement-gate-terminal, wherein the enhancement-source-terminal is coupled to the die-source-terminal, the enhancement-gate-terminal is coupled to the die-gate-terminal and the enhancement-drain-terminal is coupled to the depletion-source-terminal; and a clamp-circuit coupled between the depletion-source-terminal and the depletion-gate-terminal.

14 Claims, 5 Drawing Sheets

(51) Int. Cl.
  *H01L 29/872* (2006.01)
  *H02M 3/158* (2006.01)
  *H03K 17/687* (2006.01)
  *H01L 29/423* (2006.01)
  *H01L 29/51* (2006.01)
  *H01L 29/778* (2006.01)
(52) U.S. Cl.
  CPC ...... *H01L 29/42316* (2013.01); *H01L 29/513* (2013.01); *H01L 29/778* (2013.01)

SEMICONDUCTOR DEVICE AND ASSOCIATED METHODS

CROSS-REFERENCE TO RELATED APPLICATIONS

This application claims the priority under 35 U.S.C. § 119 of European Patent application no. 15182739.1, filed on Aug. 27, 2015, the contents of which are incorporated by reference herein.

The present disclosure relates to semiconductor devices comprising an enhancement-mode transistor and a depletion-mode transistor, and to methods of providing such devices.

According to a first aspect of the present disclosure there is provided a semiconductor device comprising: a die-source-terminal, a die-drain-terminal and a die-gate-terminal; a semiconductor-die; an insulated-gate-depletion-mode-transistor provided on the semiconductor-die, the insulated-gate-depletion-mode-transistor comprising a depletion-source-terminal, a depletion-drain-terminal and a depletion-gate-terminal, wherein the depletion-drain-terminal is coupled to the die-drain-terminal and the depletion-gate-terminal is coupled to the die-source-terminal; an enhancement-mode-transistor comprising an enhancement-source-terminal, an enhancement-drain-terminal and an enhancement-gate-terminal, wherein the enhancement-source-terminal is coupled to the die-source-terminal, the enhancement-gate-terminal is coupled to the die-gate-terminal and the enhancement-drain-terminal is coupled to the depletion-source-terminal; and a clamp-circuit coupled between the depletion-source-terminal and the depletion-gate-terminal.

Such a semiconductor device may advantageously have reduced electrical current leakage when in operation and may therefore be more energy efficient and required less cooling.

In one or more embodiments the clamp-circuit may be provided on the semiconductor-die.

In one or more embodiments the insulated-gate-depletion-mode-transistor may comprise a High Electron Mobility Transistor.

In one or more embodiments the insulated-gate-depletion-mode-transistor may comprise a Gallium Nitride Field Effect Transistor or a Silicon Carbide Field Effect Transistor.

In one or more embodiments the clamp circuit may be configured to limit the voltage between the depletion-source-terminal and the depletion-gate-terminal to a predetermined threshold voltage.

In one or more embodiments the predetermined threshold voltage may be less than the breakdown voltage of the insulation of the depletion-gate-terminal.

In one or more embodiments the clamp-circuit may comprise a diode circuit, the diode circuit having an anode coupled to the depletion-source-terminal and a cathode coupled to the depletion-gate-terminal.

In one or more embodiments the diode circuit may comprise a Schottky diode.

In one or more embodiments the diode circuit may comprise a p-n diode.

In one or more embodiments the clamp circuit may have a conduction threshold voltage that is less than a source-to-drain breakdown voltage of the enhancement-mode-transistor.

In one or more embodiments the clamp circuit may have a conduction threshold voltage that is less than an avalanche threshold voltage of the enhancement-mode-transistor.

In one or more embodiments the clamp circuit may have a conduction threshold voltage that is higher than an absolute value of a threshold voltage of the insulated-gate-depletion-mode-transistor.

In one or more embodiments the insulated-gate-depletion-mode-transistor may be provided on a first integrated circuit and the clamp-circuit may be provided on the first integrated circuit.

In one or more embodiments the enhancement-mode-transistor may be a Silicon Metal Oxide Semiconductor Field Effect Transistor.

In one or more embodiments a power switch may comprise the semiconductor device of the present disclosure.

In one or more embodiments a switched mode power supply may comprise the semiconductor device of the present disclosure.

In one or more embodiments an integrated circuit may comprise the semiconductor device of the present disclosure.

According to a further aspect of the present disclosure there is provided a method of providing a semiconductor device, comprising: providing a die-source-terminal, a die-drain-terminal and a die-gate-terminal; providing a semiconductor-die; providing an insulated-gate-depletion-mode-transistor on the semiconductor-die, the insulated-gate-depletion-mode-transistor comprising a depletion-source-terminal, a depletion-drain-terminal and a depletion-gate-terminal, wherein the depletion-drain-terminal is coupled to the die-drain-terminal and the depletion-gate-terminal is coupled to the die-source-terminal; providing an enhancement-mode-transistor, the enhancement-mode-transistor comprising an enhancement-source-terminal, an enhancement-drain-terminal and an enhancement-gate-terminal, wherein the enhancement-source-terminal is coupled to the die-source-terminal, the enhancement-gate-terminal is coupled to the die-gate-terminal and the enhancement-drain-terminal is coupled to the depletion-source-terminal; and providing a clamp-circuit coupled between the depletion-source-terminal and the depletion-gate-terminal.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

One of more embodiments will now be described by way of example only with reference to the accompanying drawings in which.

Figure 1:
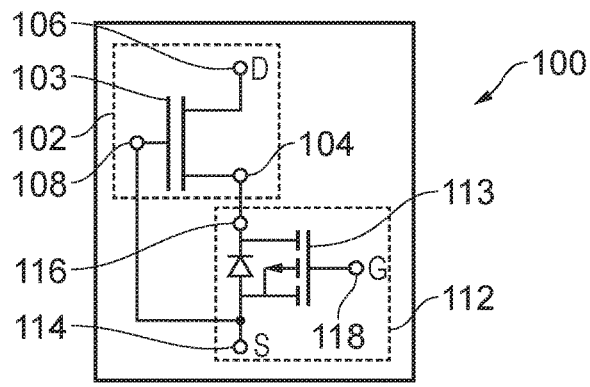
FIG. 1 shows a cascode power switch.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

This disclosure relates to an integrated overvoltage clamp circuit for cascoded power semiconductor devices. Emerging Gallium Nitride (GaN) power switches have depletion-mode (that is 'normally-on') behaviour, wherein the switch remains in a conducting state unless a suitable voltage is applied to a gate terminal to induce a non-conducting state. Such power switches can be used in a cascode configuration in order to provide 'normally-off' behaviour, wherein the switch remains in a non-conducting state unless a suitable voltage is applied to a gate terminal to induce a conducting state. In a cascode configuration a low voltage rated enhancement-mode (normally-off) power switch may be combined with a high voltage rated depletion-mode (normally-on) GaN switch. Insulated-gate GaN power devices may advantageously be employed in embodiments of the present disclosure.

FIG. 1 shows a cascode power switch 100 comprising a series connection of a normally-on (depletion-mode) power switch 103 and a normally-off (enhancement-mode) power switch 113 in a so-called 'cascode' configuration. The depletion-mode power switch 103 is provided on a semiconductor-die 102. The enhancement-mode power switch 113 is provided on a second semiconductor-die 112. The depletion-mode power switch 103, which may be a field effect transistor (FET), comprises a source terminal 104, a drain terminal 106 and a gate terminal 108. The enhancement-mode power switch 113, which may also be a FET, comprises a source terminal 114, a drain terminal 116 and a gate terminal 118. In the cascode configuration, the drain terminal 116 of the enhancement mode power switch 113 is coupled to the source terminal 104 of the depletion mode power switch 103, while the source terminal 114 of the enhancement mode power switch 112 is coupled to the gate terminal 108 of the depletion mode power switch 103. Thereby, (i) the gate terminal 118 of the enhancement mode power switch 113 may comprise a gate terminal of the cascode power switch 100; (ii) the source terminal 114 of the enhancement mode power switch 113 may comprise a source terminal of the cascode power switch 100; and (iii) the drain terminal 106 of the depletion mode power switch 103 may comprise the drain terminal of the cascode power switch 100.

The cascode configuration is advantageous for power electronics applications as new GaN and SiC (silicon carbide) power semiconductor devices, with superior device characteristics compared to Silicon based switches, become available.

Basic GaN and unipolar SiC power transistors are depletion mode (normally-on) devices. Attempts to introduce additional layers in the layer stack of a power transistor to make a device that is 'normally-off', come together with device performance penalties. Therefore, cascoding high-voltage GaN/SiC switches with, for example, conventional low-voltage silicon trench MOSFETs is a viable option to combine the advantages of Silicon and GaN/SiC power devices.

Figure 2:
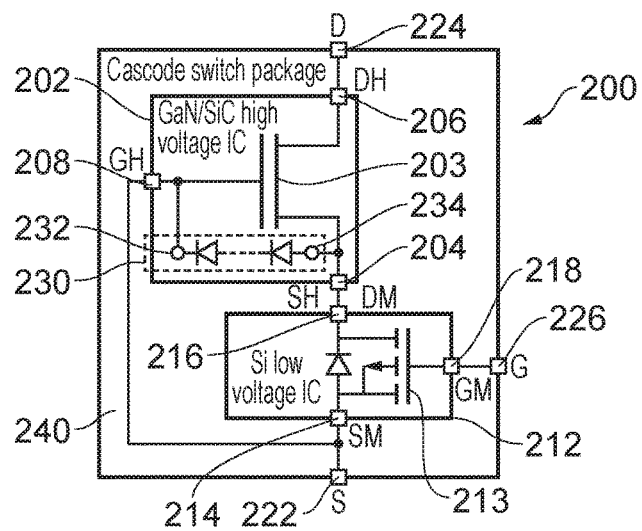
FIG. 2 shows an example embodiment of a cascode power switch comprising a clamp circuit.

FIG. 2 shows a semiconductor device 200. Features of FIG. 2 that are similar to features of FIG. 1 have been given similar reference numerals and may not be further discussed here.

The semiconductor device 200 of FIG. 2 comprises a semiconductor-die 202. The semiconductor-die 202 may comprise a single block of semiconductor material. The semiconductor-die 202 is provided on a first chip/integrated circuit 240. The semiconductor device 200 comprises a die-source-terminal 222, a die-drain-terminal 224 and a die-gate-terminal 226. These terminals 222, 224, 226 enable the semiconductor device 200 to function as a cascode power switch.

An insulated-gate-depletion-mode-transistor 203 is provided on the semiconductor-die 202. The insulated-gate-depletion-mode-transistor 203 comprises a depletion-source-terminal 204, a depletion-drain-terminal 206 and a depletion-gate-terminal 208. The depletion-drain-terminal 206 is coupled to the die-drain-terminal 224 and the depletion-gate-terminal 208 is coupled to the die-source-terminal 222.

Use of an insulated-gate-depletion-mode-transistor 203 (as opposed to, for example a Schottky gate transistor) advantageously reduces electrical leakage at the transistor's gate. Reduced electrical leakage improves energy efficiency and reduces the need to provide for cooling during operation of the semiconductor device 200.

An enhancement-mode-transistor 213 is also provided on a second semiconductor-die 212. The second semiconductor-die 212 is also provided on the first chip 240 in this example. It will be appreciated that in other examples the second semiconductor-die 212 may be the same as the semiconductor-die 202, thereby only a single semiconductor die may be provided, on which is located the insulated-gate-depletion-mode-transistor 203 and the enhancement-mode-transistor 213. It will be appreciated that in other examples (not shown) the second semiconductor-die may be provided on a second chip. The enhancement-mode-transistor 213 comprises an enhancement-source-terminal 214, an enhancement-drain-terminal 216, and an enhancement-gate-terminal 218. The enhancement-source-terminal 214 is coupled to the die-source-terminal 222. The enhancement-gate-terminal 218 is coupled to the die-gate-terminal 226. The enhancement-drain-terminal 216 is coupled to the depletion-source-terminal 204.

A clamp-circuit 230 is also provided on the semiconductor-die 202. In this example, the clamp-circuit 230 is thereby provided on the first chip. It will be appreciated that in other examples (not shown) the clamp circuit may be provided on a second semiconductor-die which may be provided on the first chip or on a second chip. The clamp-circuit 230 is coupled between the depletion-source-terminal 204 and the depletion-gate-terminal 208. In this example, the clamp-circuit 230 comprises a diode circuit, the diode circuit having an anode 234 coupled to depletion-source-terminal 204 and a cathode 232 coupled to the depletion-gate-terminal 208. It will be appreciated that the diode circuit may comprise a single diode or may comprises a plurality of diodes connected in series.

The semiconductor device 200 is an example of a cascode switch dual die solution in a single package. Conveniently the three pin package with a drain terminal, a source terminal and gate terminal is compatible with existing power semiconductors like silicon metal-oxide-semiconductor field-effect transistors (MOSFET's) or insulated-gate bipolar transistors (IGBT's). Within this package a silicon low-voltage chip, which is an example of an enhancement-mode transistor 203, may be connected with a GaN/SiC high voltage chip, which is an example of an insulated-gate depletion mode transistor 213.

The clamp circuit 230 may be integrated on the GaN/SiC high voltage chip as an additional circuit next to the insulated-gate depletion mode transistor 213 power switch, and connected between the depletion-source-terminal 204 and the depletion-gate-terminal 208.

The clamp circuit 230 ensures that the voltage across the enhancement-mode transistor 213 (which may be a low-voltage trench MOSFET) between the enhancement-source-terminal 214 and the enhancement-drain-terminal 216 does not exceed a predetermined limit and the voltage between the depletion-source-terminal 204 and the depletion-gate-terminal 208 does not exceed a breakdown voltage of the enhancement-mode transistor gate insulation.

The clamp circuit 230 may advantageously limit the maximum gate-source voltage on the depletion-mode transistor 203 terminals. This may enable use of thinner gate dielectric insulation. In examples where the depletion-mode transistor 203 comprises GaN, the use of the clamp circuit 230 may advantageously reduce requirements on reliability of the gate-insulator formed on the GaN surface. This is beneficial since dielectrics deposited on wide-band-gap semiconductors may have a lower breakdown field and consequently worse time-dependent-dielectric-breakdown characteristics.

The clamp circuit 230 may have a conduction threshold voltage that is higher than an absolute value of a threshold voltage of the insulated-gate-depletion-mode-transistor.

The clamp circuit 230 also enables reduction of the voltage rating of the enhancement-mode transistor 213 which advantageously results in lower total on resistance, a smaller footprint, and/or lower on-resistance in a given package.

Cascoded switches that do not comprise a clamp circuit may have disadvantages that may hamper their use in power conversion applications.

The clamp circuit 230 may advantageously prevent avalanche currents occurring in the enhancement-mode transistor 213. Prevention of such currents may improve the reliability of the enhancement mode transistor 213, by preventing the high drain-source voltages that may cause avalanche currents to occur. The clamp circuit 230 may also advantageously prevent avalanche currents or gate isolation breakdown of the depletion mode transistor 203 which may otherwise occur due to high source-gate voltages.

When turning off the cascode switch, enhancement-gate-terminal 218 of the enhancement mode transistor 213 will be discharged by a gate driver (not shown) connected between the die-source-terminal 222 and the die-gate-terminal 226. Once the enhancement-mode transistor 213 gate-source voltage ($V_{GM}$) is at a threshold level ($V_{thH}$), the enhancement-mode transistor 213 will turn off. The enhancement mode transistor's 213 drain source voltage ($V_{DM}$) will increase and generate the needed negative gate-source voltage to turn-off the depletion-mode transistor 203. At this moment the enhancement-drain-terminal 216 and the depletion-source-terminal 204 will become a floating node and the voltage across the enhancement-mode transistor 213 will be determined by the following equation:

$$V_{DM} = \frac{C_{DSH}}{C_{DSH} + (C_{GSH} + C_{DSM} + C_{GDM})} V_{DH} - V_{thH}$$

As indicated, the peak voltage across the enhancement mode transistor 213 is dependent on:
threshold voltage of the depletion-mode transistor $V_{thH}$
maximum cascode drain voltage $V_{DH}$
a capacitance ratio between the enhancement-mode transistor 213 and the depletion mode transistor 203, specifically
depletion-mode transistor drain-source capacitance $C_{DSH}$
depletion-mode transistor gate source capacitance $C_{GSH}$
enhancement-mode transistor drain-source capacitance $C_{DSM}$
enhancement-mode transistor gate-drain capacitance $C_{GDM}$ For example, a particular cascode switch may be rated for $V_{DH}$=600V, the depletion-mode transistor 203 may have a threshold voltage $V_{thH}$=−3V and a 30V rated enhancement-mode transistor 213 may be used. To ensure the enhancement-mode transistor 213 drain voltage $V_{DM}$ does not exceed the limit of $V_{DM}$=30V, the following capacitance ratio must be fulfilled:

$$\frac{(C_{GSH} + C_{DSM} + C_{GDM})}{C_{DSH}} = \frac{V_{DH}}{V_{DM} + V_{thH}} - 1 = 21.2$$

With typical values for these components, this requirement may be difficult to fulfil without integrating or adding capacitance in parallel with the enhancement-mode transistor 213.

Figure 3:
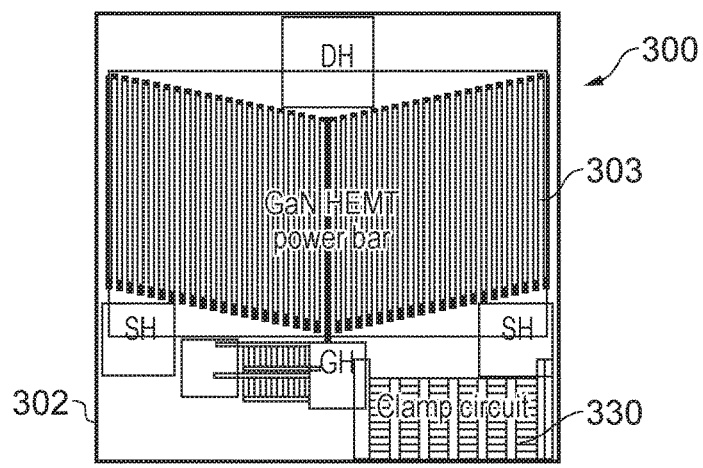
FIG. 3 shows an example embodiment of an implementation of a part of the cascode power switch of FIG. 2.

FIG. 3 shows a semiconductor device 300 that may form part of a cascode power switch. The semiconductor device 300 comprises a semiconductor-die 302, with a clamp circuit 330 and a high voltage GaN depletion mode transistor 303 both integrated onto the semiconductor die 302. The layout of the semiconductor device 300 may be suitable for a 600V rated GaN High Electron Mobility Transistor (HEMT) with integrated clamp circuit 330.

The semiconductor device 300 has a 600V/90 mΩ GaN HEMT 303 and a clamp circuit 330 comprising six low-voltage Schottky diodes connected in series. The diodes may occupy about 10% of the total chip area.

Figure 4:
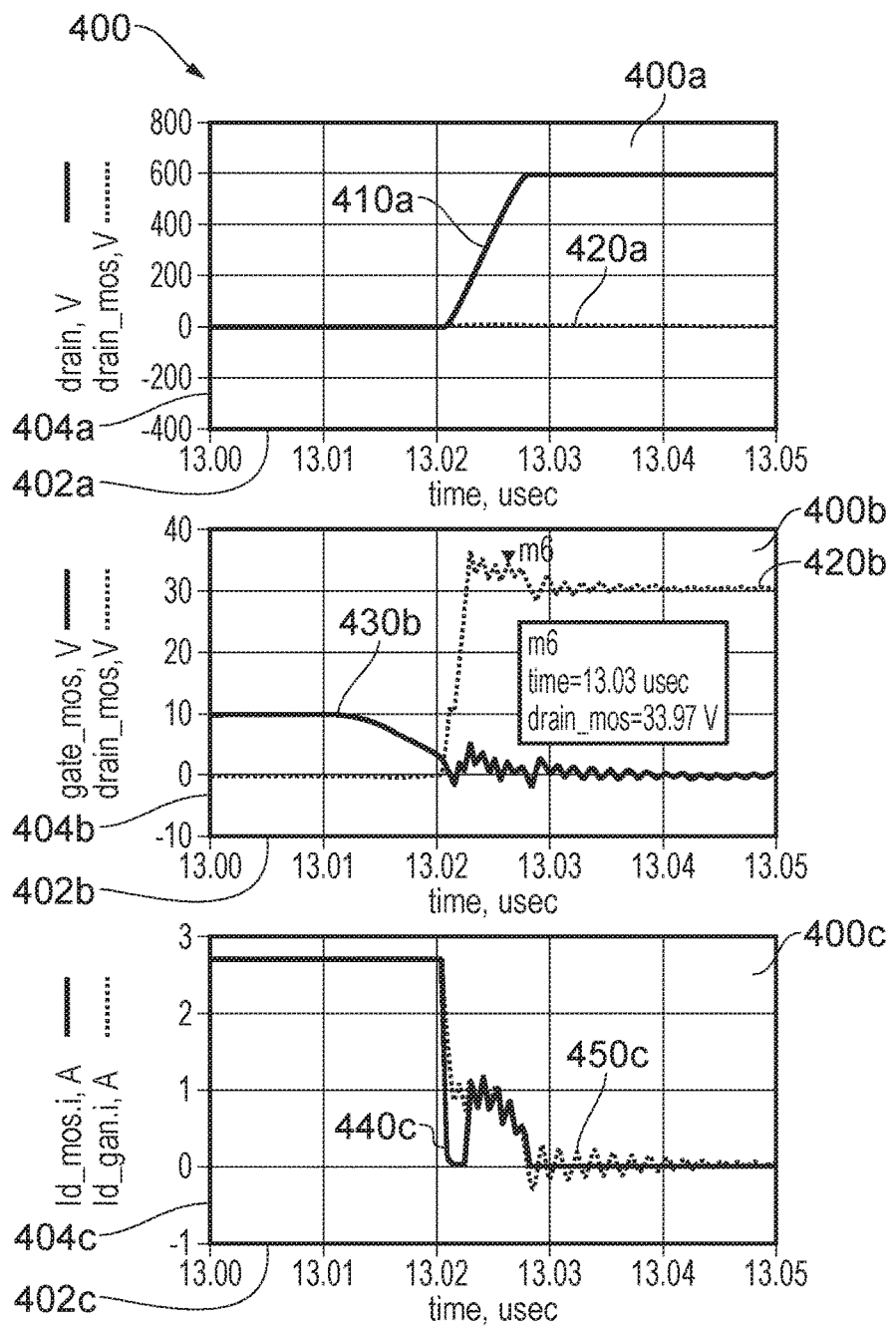
FIG. 4 shows an example embodiment of a set of simulation results of a cascode power switch being switched off.

FIG. 4 shows simulation results 400 of a cascode switch that is not fulfilling the capacitance requirement disclosed above, and which does not comprise a clamp circuit, as disclosed above.

A first chart 400a shows time on a first axis 402a and voltage on a second axis 404a. A first data-set 410 shows the voltage across a depletion-mode transistor. A second data-set 420a shows a voltage across an enhancement-mode transistor. As can be seen, when the cascode switch is switched off the voltages 410, 420 increase.

A second chart 400b shows time on a first axis 402b and voltage on a second axis 404b. A third data-set 430b shows voltage at the cascode switch gate terminal. A fourth data-set 420b shows a voltage across the enhancement-mode transistor in greater detail than the first chart 400a. The drain voltage $V_{DM}$ 420b across the enhancement-mode transistor is shown to be exceeding the limit of 30V. Consequently, the enhancement-mode transistor will be conducting avalanche current after being turned off, which is undesirable.

The enhancement-mode transistor would conduct avalanche current during every turn-off in an application. Hence, operating this simulated cascode switch in a power converter circuit would lead to repetitive avalanche currents which could reduce lifetime and reliability of the cascode switch.

Furthermore, if the breakdown voltage of the depletion-mode transistor gate insulation (high voltage chip gate oxide) is lower than the high voltage occurring during the turn-off, the high voltage will cause a gate insulation breakdown and may thereby destroy the cascode switch.

A third chart 400c shows time on a first axis 402c and current on a second axis 404c. A fifth data-set 440c shows current flowing through the enhancement-mode transistor. As can be seen, a significant amount of avalanche current flows through the transistor after the cascode switch has been switched off. A sixth data set 450c shows the current flowing through the depletion-mode transistor.

Figure 5:
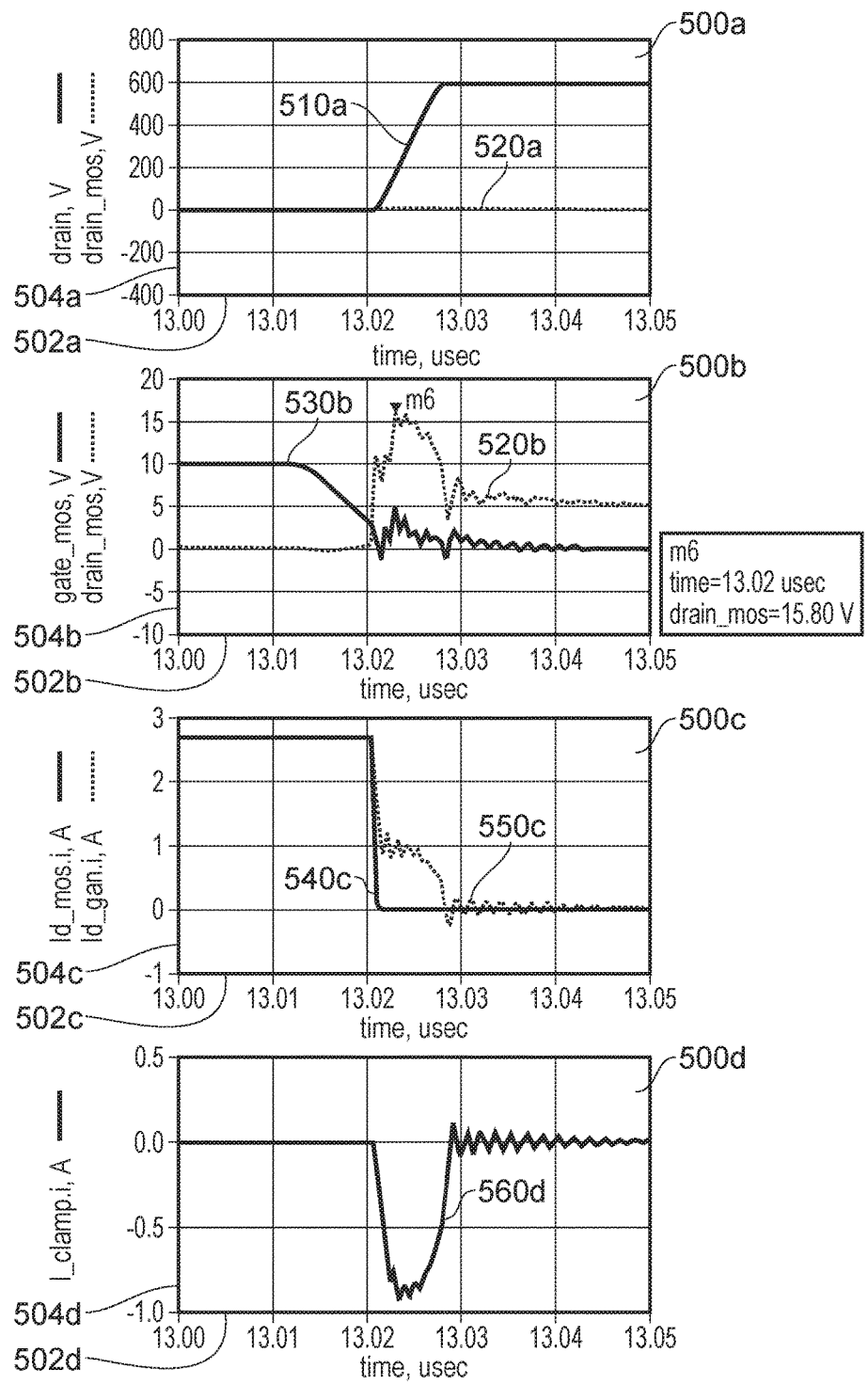
FIG. 5 shows an example embodiment of a set of simulation results of a cascode power switch, comprising a clamp circuit, being switched off.

FIG. 5 shows simulation results of a cascode switch turn-off under the same operating conditions as those shown in FIG. 4, but with a clamp circuit connected as disclosed above. Features of FIG. 5 that are similar to features of FIG. 4 have been given similar reference numerals and will not necessarily be discussed further here.

A second chart 500b shows that the voltage 520b across the enhancement-mode transistor is limited, by the clamp circuit, to 16V (which compares favourably to the level in excess of 30V in FIG. 4). The charge current of the depletion-mode transistor drain-source capacitance $C_{DSH}$ that, in the absence of the clamp circuit would have been conducted by the enhancement-mode transistor as an avalanche current, is instead conducted by the clamp circuit. Consequently, the current 540c conducted by the enhancement-mode transistor, shown in a third chart 500c, falls to approximately zero when the switch is turned off, without any avalanche current being conducted. A simulated clamp circuit current 560d is shown in a fourth chart 500d, for completeness.

In some examples, the depletion mode transistor may be a Gallium Nitride transistor, while the clamp circuit may comprise one or more Schottky diodes. To provide both a GaN transistor and one or more Schottky diodes on the same semiconductor die, two process modules may be integrated together: an insulated gate process module; and a Schottky gate process module.

The insulated gate process module is used to make the power switch gate contacts achieve reduced electrical leakage. The Schottky gate process module is used to integrate the voltage limiting clamp circuit. The different process implementation combining efficiently insulated gate process module with Schottky process module will be disclosed in the following discussion.

Figure 6:
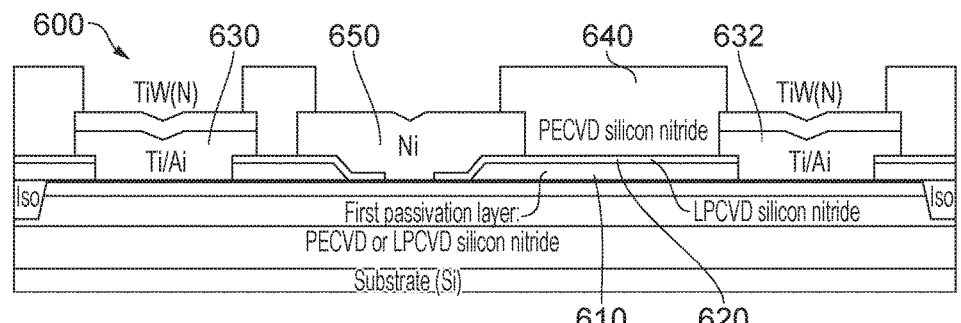
FIG. 6 shows an example embodiment of a high electron mobility transistor.

FIG. 6 shows a cross-section of a HEMT 600 with a first 610 and a second 620 passivation layer underneath a Schottky gate 650. It will be appreciated that there are several ways that a Metal Insulator Semiconductor High Electron Mobility Transistor (MISHEMT) may be integrated in the same process as a HEMT, and that the following process will be used as an example of how to build a semiconductor device according to the present disclosure.

The process starts with the deposition of a Plasma-enhanced chemical vapour deposition (PECVD) nitride 610, typically at 400° C. Alternatively, a low-pressure chemical vapour deposition (LPCVD) nitride could instead be deposited, typically at 800° C. The use of different nitrides enables optimization of electron trapping effects that result in current collapse, caused by an increase of the on-resistance when switching the device. Depending on the nitride of choice the patterning of a slanted gate foot can be performed wet, with a buffered oxide etch for example, or dry, using a fluorine based chemistry such as $SF_6$. On top of this first passivation layer 610 then a second silicon nitride layer 620 is deposited. The thickness of this silicon nitride layer 620 is preferably limited to have a maximum effect of the Schottky metal as an effective field plate to supress the electric field underneath it. The second passivation layer 620 should also be dense enough to supress the leakage of electrons through it. It may therefore be appropriate to use LPCVD for the deposition of the second passivation layer 620. The next steps in the process are the formation of source 630 and drain 632 Ohmic contacts and implantation of a species like argon to enable device to device isolation. The HEMT 600 further comprises an optional dielectric layer 640 which in this example is a PECVD silicon nitride formed on top of the LPCVD nitride passivation layer 620. The optional dielectric layer 640 may advantageously minimize the impact of the Ohmic metal dry etch process.

After the source 630, drain 632 and gate 650 contacts have been fabricated, a PECVD nitride layer, such as a 300 nm PECVD layer, deposited at 400 degrees Celsius, may be fabricated as a pre-metal dielectric for the so-called metal-1, typically consisting of an approximately 100 nm diffusion barrier with a 1-1.5 μm thick aluminium layer on top. The dielectric layer 640 is shown, after etching the contacts, before metal-1 deposition.

Figure 7:
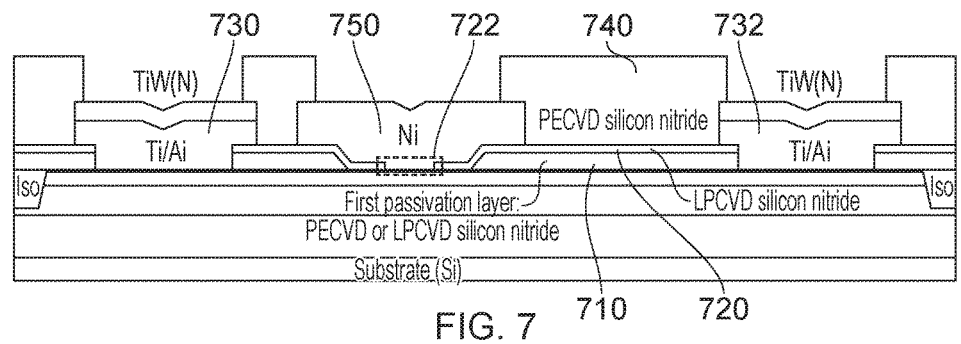
FIG. 7 shows an example embodiment of a metal insulator semiconductor high electron mobility transistor.

FIG. 7 shows a MISHEMT 700. Features of FIG. 7 that are similar to features of FIG. 6 have been given similar reference numerals and may not necessarily be discussed further here. A method for creating the MISHEMT 700 from a process similar to that used in relation to the device of FIG. 6 would be to continue the process shown in FIG. 6, except for the etching of the LPCVD silicon nitride passivation layer 720 in the gate foot. This could be done by design, in particular the mask that defines the gate foot etch, and can involve no additional process steps. Thereby, a portion 722 of the second passivation layer 720 is configured to provide electrical insulation for the gate terminal 750.

Figure 8A:
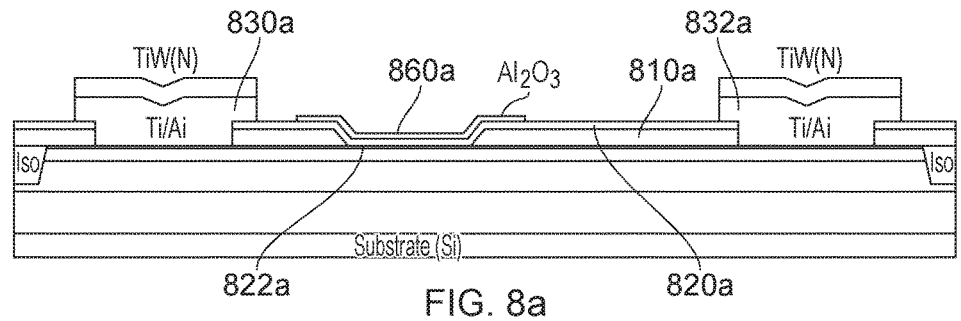
FIG. 8a shows an example embodiment of a partially constructed metal insulator semiconductor high electron mobility transistor before addition of any gate metal.

FIG. 8a shows a partially constructed metal insulator semiconductor high electron mobility transistor (MISHEMT) 800a before the deposition of any gate metal. To optimize separately both the Schottky-based devices and the MISHEMT 800a, a thin dielectric layer may be introduced. For example, a 20 nm $Al_2O_3$ layer 860a, may be deposited in an Atomic Layer Deposition (ALD) furnace or an LPCVD furnace with multiple reaction chambers, even directly following the deposition of the second nitride passivation layer 820, without the wafers leaving the furnace. The $Al_2O_3$ layer 860a can be easily patterned selectively to the LPCVD silicon nitride by wet etching in a standard buffered oxide etch (BOE). Since these layers are typically exposed to post-deposition high temperature anneals of approximately 900° C., it can optionally be combined with the Rapid Thermal Anneal (RTA) that is needed to form the Ohmic source 830a and drain 832a contacts. Since the anneal has an impact on the etch rate in BOE, selectivity is lost when this is done before patterning, so the patterning of the $Al_2O_3$ 860a may be done before opening the source 830a and drain 832a contact windows in the silicon nitride passivation layers 810, 820 and deposition and patterning of the Ohmic metal. The dry etch patterning step of the Ohmic metal formation should be selective to both $Al_2O_3$ and silicon nitride. Optionally, the $Al_2O_3$ layer 860a may be deposited after patterning the Ohmic metal, or even after the Ohmic RTA, which would open the possibility for separately tuning the $Al_2O_3$ deposition process and anneal, without impact on the Ohmic metal removal. Should selectivity of the Ohmic metal etch towards the $Al_2O_3$ be a problem, or should there otherwise be an impact on electron trapping due to the dry etch, a sacrificial PECVD layer may be added on top of the $Al_2O_3$. In those areas where a Schottky-based device is created the $Al_2O_3$ can be removed completely. It is possible to create different types of MISHEMTs, featuring either LPCVD silicon nitride only or the stack of $Al_2O_3$ on silicon nitride or $Al_2O_3$ only.

Figure 8B:
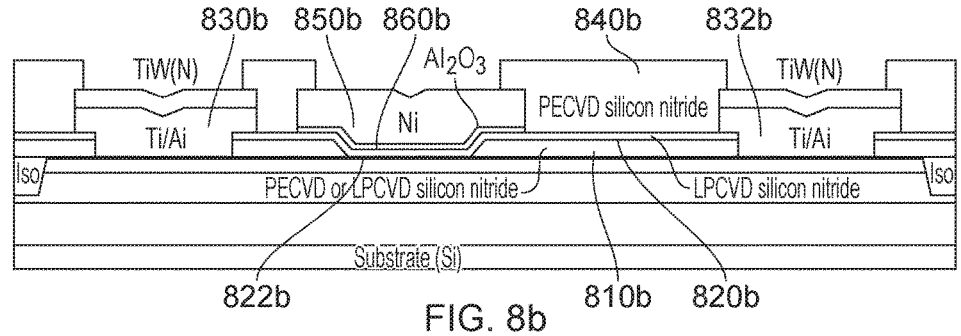
FIG. 8b shows an example embodiment of the transistor of FIG. 8a with an additional Nickel gate terminal.

FIG. 8b shows a transistor 800b similar to that of FIG. 8a with an additional Nickel gate terminal 850b. Features of FIG. 8b that are similar to features of FIG. 8a have been given similar reference numerals and may not be further discussed here. In order to form the transistor 800b from a starting point provided by the device of FIG. 8a, it is possible to follow the default process flow, depositing a suitable gate metal 850b like Ni (although it will be appreciated that other materials, such as TiWN, may be used) and patterning the gate metal accordingly. Bringing the transistor 800b to the same process step as shown in FIGS. 6 and 7 is finally illustrated in FIG. 8b. Whether the $Al_2O_3$ layer 860b is completely enclosed by Ni or not is again subject to choice of mask design. As described above, the devices of FIGS. 6, 7 and 8b can be made side by side.

Figure 9:
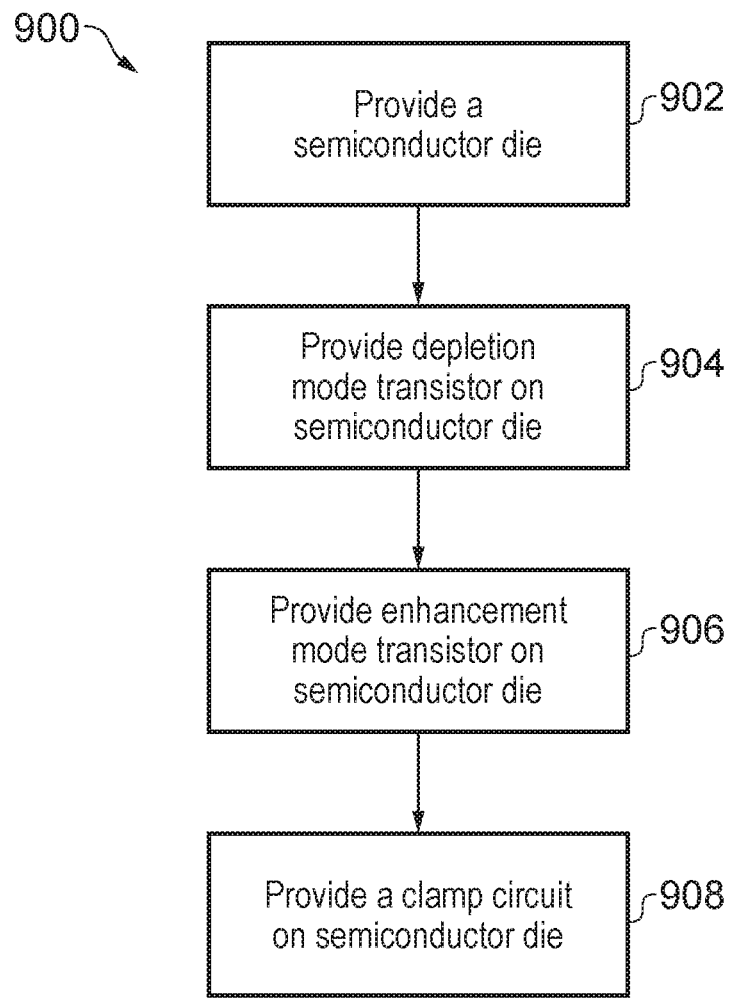
FIG. 9 shows a flow chart that depicts an example embodiment of a method for providing a semiconductor device.

FIG. 9 shows a flow chart 900 that depicts a method of providing a semiconductor device. The method comprises a first step 902 of providing a semiconductor-die. A diesource-terminal, a die-drain-terminal and a die-gate-terminal may be formed on the semiconductor-die. The formation of these terminals may occur during the first step. It will be appreciated that the formation of these terminals may occur after the first step and that the remaining steps may be completed in any order.

The method comprises a second step 904 of providing an insulated-gate-depletion-mode-transistor on the semiconductor-die. The insulated-gate-depletion-mode-transistor may be as described above in relation to FIG. 2. Optionally, the second step 904 may include deposition of a second passivation layer of the type disclosed above in relation to FIGS. 7, 8a and 8b. In some examples the second passivation layer may comprise silicon nitride, which may be deposited by a low-pressure chemical vapour deposition process. The second step 904 may optionally include deposition of a dielectric layer on top of the second passivation layer, as disclosed above in relation to FIGS. 8a and 8b. In some examples the dielectric layer may comprise $Al_2O_3$.

The second step 904 may optionally include deposition of a conductor on top of the second passivation layer, and where it is present, on top of the dielectric layers. The conductor may be configured to form a gate for the insulated-gate-depletion-mode-transistor. The Nickel gate terminal of FIGS. 7, 8a and 8b is an example of such a conductor. The second passivation layer and, where present, the dielectric layer may be configured to form an insulting barrier between the conductor and the semiconductor die, to isolate the conductor from the semiconductor die.

The method comprises a third step 906 of providing an enhancement-mode-transistor. In some examples the enhancement-mode-transistor may be provided on a second semiconductor-die. In some examples the second semiconductor-die may comprise the semiconductor-die, while in other examples the second semiconductor-die may be different from the semiconductor-die. The enhancement-modetransistor may be as described above in relation to FIG. 2.

The method comprises a fourth step 908 of providing a clamp-circuit on the semiconductor-die, the clamp-circuit coupled between the depletion-source-terminal and the depletion-gate-terminal of the insulated-gate-depletionmode-transistor.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A semiconductor device comprising:
   a die-source-terminal, a die-drain-terminal and a die-gate-terminal;
   a semiconductor-die;
   an insulated-gate-depletion-mode-transistor provided on the semiconductor-die, the insulated-gate-depletion-mode-transistor comprising a depletion-source-terminal, a depletion-drain-terminal and a depletion-gate-terminal, wherein the depletion-drain-terminal is coupled to the die-drain-terminal and the depletion-gate-terminal is coupled to the die-source-terminal;
   an enhancement-mode-transistor comprising an enhancement-source-terminal, an enhancement-drain-terminal and an enhancement-gate-terminal, wherein the enhancement-source-terminal is coupled to the die-source-terminal, the enhancement-gate-terminal is coupled to the die-gate-terminal and the enhancement-drain-terminal is coupled to the depletion-source-terminal; and
   a clamp-circuit coupled between the depletion-source-terminal and the depletion-gate-terminal, wherein the clamp-circuit comprises a diode circuit, and wherein the diode circuit has an anode coupled to the depletion-source-terminal and a cathode coupled to the depletion-gate-terminal.

2. The semiconductor device of claim 1, wherein the clamp-circuit is provided on the semiconductor-die.

3. The semiconductor device of claim 1, wherein the insulated-gate-depletion-mode-transistor comprises a High Electron Mobility Transistor.

4. The semiconductor device of claim 1, wherein the insulated-gate-depletion-mode-transistor comprises a Gallium Nitride Field Effect Transistor or a Silicon Carbide Field Effect Transistor.

5. The semiconductor device of claim 1, wherein the clamp circuit is configured to limit the voltage between the depletion-source-terminal and the depletion-gate-terminal to a predetermined threshold voltage.

6. The semiconductor device of claim 5, wherein the predetermined threshold voltage is less than the breakdown voltage of the insulation of the depletion-gate-terminal.

7. The semiconductor device of claim 1, wherein the diode circuit comprises a Schottky diode.

8. The semiconductor device of claim 1, wherein the clamp circuit has a conduction threshold voltage that is less than a source-to-drain breakdown voltage of the enhancement-mode-transistor or an avalanche threshold voltage of the enhancement-mode-transistor.

9. The semiconductor device of claim 1, wherein the clamp circuit has a conduction threshold voltage that is higher than an absolute value of a threshold voltage of the insulated-gate-depletion-mode-transistor.

10. The semiconductor device of claim 1, wherein the insulated-gate-depletion-mode-transistor is provided on a first integrated circuit and the clamp-circuit is provided on the first integrated circuit.

11. The semiconductor device of claim 1, wherein the enhancement-mode-transistor is a Silicon Metal Oxide Semiconductor Field Effect Transistor.

12. A power switch or a switched mode power supply comprising the semiconductor device of claim 1.

13. An integrated circuit comprising the semiconductor device of claim 1.

14. A method of providing a semiconductor device, comprising: providing a die-source-terminal, a die-drain-terminal and a die-gate-terminal; providing a semiconductor-die;
   providing an insulated-gate-depletion-mode-transistor on the semiconductor-die, the insulated-gate-depletion-mode-transistor comprising a depletion-source-terminal, a depletion-drain-terminal and a depletion-gate-terminal, wherein the depletion-drain-terminal is coupled to the die-drain-terminal and the depletion-gate-terminal is coupled to the die-source-terminal;
   providing an enhancement-mode-transistor, the enhancement-mode-transistor comprising an enhancement-source-terminal, an enhancement-drain-terminal and an enhancement-gate-terminal, wherein the enhancement-source-terminal is coupled to the die-source-terminal, the enhancement-gate-terminal is coupled to the die-gate-terminal and the enhancement-drain-terminal is coupled to the depletion-source-terminal; and
   providing a clamp-circuit coupled between the depletion-source-terminal and the depletion-gate-terminal, wherein the clamp-circuit comprises a diode circuit, and wherein the diode circuit has an anode coupled to the depletion-source-terminal and a cathode coupled to the depletion-gate-terminal.

* * * * *